(12) United States Patent
Höllinger et al.

(10) Patent No.: US 6,992,533 B2
(45) Date of Patent: Jan. 31, 2006

(54) TEMPERATURE-STABILIZED OSCILLATOR CIRCUIT

(75) Inventors: Werner Höllinger, Villach (AT); Mario Motz, Wernberg (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/850,677

(22) Filed: May 21, 2004

(65) Prior Publication Data

US 2004/0251980 A1  Dec. 16, 2004

Related U.S. Application Data

(63) Continuation of application No. PCT/DE02/03907, filed on Oct. 15, 2002.

(30) Foreign Application Priority Data

Nov. 22, 2001  (DE) ................ 101 57 292

(51) Int. Cl.
*H03B 5/24* (2006.01)
(52) U.S. Cl. .................. 331/143; 331/111; 331/176
(58) Field of Classification Search ............. 331/111, 331/143, 175, 176
See application file for complete search history.

(56) References Cited

U.S. PATENT DOCUMENTS

| 4,205,279 | A | 5/1980 | Beutler | 331/111 |
|---|---|---|---|---|
| 5,250,914 | A | 10/1993 | Kondo | 331/111 |
| 5,352,934 | A | 10/1994 | Khan | 307/296.1 |
| 5,491,456 | A | 2/1996 | Kay et al. | 331/57 |
| 5,760,657 | A | 6/1998 | Johnson | 331/175 |
| 6,157,270 | A | 12/2000 | Tso | 331/176 |
| 6,870,433 | B2 * | 3/2005 | Motz | 331/111 |

FOREIGN PATENT DOCUMENTS

| EP | 0 219 994 A2 | 4/1987 |
|---|---|---|
| EP | 0 944 169 A2 | 9/1999 |
| FR | 2 783 372 A1 | 9/1998 |
| WO | WO 99/38260 | 7/1999 |

OTHER PUBLICATIONS

M.P. Flynn et al.; "A 1.2-$\mu$m CMOS current-Controlled Oscillator"; IEEE Journal of Solid-State Circuits, vol. 27, No. 7, pps. 982-987, Jul. 7, 1992.
I.M. Filanovsky et al.; "A Novel CMOS Multivibrator"; Analog Integrated Circuits and Signal Processing, vol. 2, Boston, pps. 217-222, 1992.
G. Ferri et al.; "A novel low voltage low power oscillator as a capacitive sensor interface for portable applications"; Sensors and Actuators, vol. 76, pps. 437-441, 1999.
U. Tietze et al.; "Halbleiter-Schaltungstechnik"; Springer Verlag, Berlin, 11th Edition, p. 618, 1999.
Dr. R. Holberg et al., "CMOS Analog Circuit Design"; New York, Oxford University Press, The Oxford Series in Electrical and Computer Engineering, "Equivalent Circuit of the 555 CMOS Timer", p. 655, 1888.

* cited by examiner

Primary Examiner—David Mis
(74) Attorney, Agent, or Firm—Baker Botts L.L.P.

(57) ABSTRACT

Temperature-stabilized oscillator circuit A temperature-stabilized oscillator circuit (1) comprises a first part with a first temperature dependence and a second part with a second temperature dependence, which is different from the first temperature dependence. A charge storage device (C2), a controllable upward-integration current source (T2) for charging the charge storage device (C2), a controllable downward-integration current source (TB3) for discharging the charge storage device (C2) and two resistors (R2, R1) having the same temperature coefficients are contained in each case in one of the two parts.

16 Claims, 2 Drawing Sheets

TEMPERATURE-STABILIZED OSCILLATOR CIRCUIT

CROSS REFERENCE TO RELATED APPLICATION

This application is a continuation of copending International Application No. PCT/DE02/03907 filed Oct. 15, 2002 which designates the United States, and claims priority to German application no. 101 57 292.1 filed Nov. 22, 2001.

TECHNICAL FIELD OF THE INVENTION

The present invention generally relates to an oscillator circuit based on cyclic charging and discharging of a charge storage device. In particular the invention relates to an oscillator circuit which provides an operating clock for apparatuses in standby operation.

DESCRIPTION OF RELATED ART AND BACKGROUND OF THE INVENTION

Integrated circuits generally obtain their operating clock during normal operation from a crystal oscillator. During standby operation, integrated circuits are often supplied with the operator clock by an oscillator circuit or a phase shifter oscillator circuit, since these circuits are distinguished by a low current consumption.

Oscillator circuits have a charge storage device which is alternately charged and discharged by an upward-integration current source and by a downward-integration current source, respectively. The charge storage device is furthermore connected to a comparator, which measures the charge state of the charge storage device and, upon reaching a predetermined upper comparator threshold, changes over from the charging process to the discharging process. Correspondingly, in the event of the charge state falling to a lower determined comparator threshold, the discharging process is deactivated and the charging process is activated instead.

Such oscillator circuits which are suitable for integration into an integrated circuit are described for example in the articles "A 1.2 μm CMOS Current-Controlled Oscillator" by Michael P. Flynn and Sverre U. Lidholm, published in IEEE Journal of Solid-State Circuits, volume 27, No. 7, July 1992, pages 982–987, and "A Novel CMOS Multivibrator" by I. M. Filanovsky and H. Baltes, published in Analog Integrated Circuits and Signal Processing, volume 2, 1992, pages 217–222, and "A novel low voltage low power oscillator as a capacitive sensor interface for portable applications" by Giuseppe Ferri and Pierpaolo De Laurentiis, published in Sensors and Actuators, volume 76, 1999, pages 437–441. In the oscillator circuits presented in these articles, a capacitor is in each case provided as the charge storage device.

The principle of a univibrator, on which the oscillator circuits are based, is illustrated in figure 6.50 on page 618 of the book "Halbleiter-Schaltungstechnik" ["Semiconductor circuitry"] by Ulrich Tietze and Christoph Schenk, published by Springer-Verlag, Berlin, 1999, $11^{th}$ edition.

Applications of an oscillator circuit in the field of telecommunications require a high frequency stability. Therefore, the free-running frequency of an oscillator circuit, with the crystal frequency, is adjusted by digital divider ratios. Furthermore, the frequency generated by an oscillator circuit is intended to be largely independent of temperature fluctuations, operator voltage fluctuations, phase noise and also technology variations. Moreover, the oscillator circuit is intended to require a low operating voltage, have a low operating voltage dependence, take up little chip area and be able to be implemented in an integrated circuit.

The abovementioned quality requirements made of oscillator circuits also apply to applications in sensors. However, adjustment to a very precise crystal frequency is not usually necessary in applications of this type.

In order to obtain a greatest possible stability of the oscillator frequency with respect to temperature fluctuations, it is known to provide oscillator circuits with resistors having different temperature coefficients. However, what is disadvantageous about such compensation of temperature fluctuations is that technologically governed variations both of the temperature coefficients and of the absolute values of the resistors used bring about only a low temperature stability of the oscillator frequency.

Furthermore, it is known to bring about a temperature stability of the oscillator frequency by means of additional external components, such as e.g. external resistors, with low temperature coefficients or by means of adjustment on the wafer using an EEPROM or by means of zener zapping. What is common to these known measures is a large production outlay with the high costs associated therewith.

SUMMARY OF THE INVENTION

It is an object of the invention to provide an oscillator circuit by means of which the temperature coefficient of the oscillator frequency can be set to a predetermined value and by means of which, in particular, a high temperature stability of the oscillator frequency, an operating voltage suppression and a low 1/f noise are achieved.

The formulated object on which the invention is based can be achieved by a temperature-stabilized oscillator circuit based on cyclic charging and discharging of a charge storage device, comprising a charge storage device, a controllable upward-integration current source for charging the charge storage device, a controllable downward-integration current source for discharging the charge storage device, a bandgap reference circuit for generating a reference voltage, which is dropped across a first resistor contained in the bandgap reference circuit, a second resistor, across which is dropped a voltage which is proportional to the reference voltage, the two resistors essentially having the same temperature coefficients, a comparator for controlling the upward-integration current source and the downward-integration current source in a manner dependent on the charge state of the charge storage device, a predetermined lower comparator threshold and a predetermined upper comparator threshold, a first circuit branch containing the controllable upward-integration current source or the controllable downward integration current source, and a second circuit branch containing the comparator and/or serving to generate the two comparator thresholds (VCL, VCH), wherein the first circuit branch and/or the second circuit branch comprising, at least occasionally, in each case two mutually superposed partial currents with different temperature dependences, the first circuit branch and the second circuit branch and in particular at least one further circuit branch of the oscillator circuit in each case having, at least occasionally, a sum or a difference of two superposed partial currents with different temperature dependences, the partial currents being able to be set or being set in such a way that linear terms and quadratic terms and in particular higher-order terms of the temperature dependence of the oscillator frequency are essentially minimized, and the partial currents being generated in particular by the bandgap reference circuit.

The first resistor and the second resistor can be of the same type of resistor. At least one of the partial currents can be generated by means of the bandgap reference circuit. The bandgap reference circuit can be connected to the first and/or to the second circuit branch via at least one current mirror. The at least one current mirror can be designed for dynamic element matching. The circuit may further comprise at least one current mirror which feeds the first circuit branch and/or the second circuit branch and to whose output a third resistor is connected, the third resistor may have in particular the same temperature coefficient and/or the same resistance as the first and second resistors. A first MOS transistor as controllable upward-integration current source, a second MOS transistor for switching the upward-integration operation on and off and the charge storage device can be connected in series in the first circuit branch. In the second circuit branch, the comparator in the form of a third MOS transistor, the gate terminal of which is connected to the charge storage device, can be connected in series with the second resistor, across which is dropped a differential voltage formed from the difference between the upper comparator threshold and the lower comparator threshold. The controllable downward integration current source in the form of a bipolar transistor or a fourth MOS transistor, a fifth MOS transistor for switching the downward-integration operation on and off and the charge storage device can be connected in series. The charge storage device can be formed at least partly as a gate oxide capacitance. The temperature-stabilized oscillator circuit may further comprise a sixth MOS transistor, which is connected in series with the third MOS transistor and has in particular the same conductivity type as the third MOS transistor. The sixth MOS transistor can be connected as a diode. The first resistor and the second resistor may have small variations of their temperature coefficient and/or small variations of their absolute value. All the resistors of the oscillator circuit essentially may have the same temperature coefficients and, in particular, are of the same type of resistor. The components of the oscillator circuit can be monolithically integrated on a common fixed substrate. The oscillator circuit can be realized by means of CMOS technology.

A temperature-stabilized oscillator circuit according to the invention operates according to the principle of cyclic charging and discharging of a charge storage device. For this purpose, the oscillator circuit comprises a first circuit part having a first electrical property characterized by a first temperature dependence, and a second circuit part having a corresponding second electrical property characterized by a second temperature dependence. The two temperature dependences have an oppositely directed or at least different behavior. The electrical properties of the two circuit parts may be understood to be, by way of example, currents or voltages. Furthermore, the oscillator circuit comprises, as components, the charge storage device, a controllable upward-integration current source for charging the charge storage device, a controllable downward-integration current source for discharging the charge storage device, a first resistor and a second resistor. The oscillator circuit components present above may be contained in each case in the first circuit part or in the second circuit part or in another part of the oscillator circuit. Furthermore, the two resistors have essentially identical temperature coefficients and are preferably also of the same type of resistor. In this case, the temperature coefficient specifies the change in the resistance with a temperature change. A type of resistor is understood to be the kind of resistor, such as e.g. a carbon film resistor or a metal film resistor.

In the case of the oscillator circuit according to the invention, a temperature change is compensated for by the oppositely directed or at least different temperature dependences of the two circuit parts of the oscillator circuit. If the temperature changes, then one electrical property, which determines one circuit part, rises and the other electrical property, which determines the other circuit part, simultaneously falls or rises with a different temperature coefficient. Overall, this brings about an equalization between the two electrical properties, so that, by way of example, the sum or the difference or the product of the two electrical properties remains constant over a certain temperature range. As a result, it is possible ultimately to set the temperature dependences of those quantities which determine the oscillator frequency. Consequently, the temperature coefficient of the oscillator frequency can be set to a predetermined value and, in particular, it is possible to obtain a high temperature stability of the oscillator frequency.

In the case of the oscillator circuit according to the invention, it is furthermore advantageous that the two resistors essentially have the same temperature coefficients and, in particular, are also of the same type of resistor. The temperature dependence of the oscillator frequency is minimized further as a result. Some known oscillator circuits employ the opposite principle, i.e. resistors having different or oppositely directed temperature coefficients are used for the purpose of temperature compensation. In this case, however, technological variations of the resistors result overall in a poorer temperature compensation than that achieved by the present invention.

The oscillator circuit according to the invention advantageously comprises a comparator, a first circuit branch and a second circuit branch. The comparator controls the upward-integration and downward-integration current sources. This control is carried out by the comparator in a manner dependent on the charge state of the charge storage device, a predetermined lower comparator threshold and a predetermined upper comparator threshold. The first circuit branch contains the controllable upward-integration current source, and the second circuit branch contains the comparator and/or serves to generate the lower and upper comparator threshold.

In accordance with a preferred refinement of the invention, two mutually superposed partial currents having different temperature dependences flow, in each case at least occasionally, through the first circuit branch and/or the second circuit branch. By way of example, it may be provided that, in the circuit branches, a sum or a difference is formed in each case from the two partial currents. Furthermore, the two partial currents may preferably have oppositely directed or at least different temperature dependences. By means of such partial currents whose temperature dependences mutually compensate for one another, the desired temperature coefficient of the oscillator frequency can be set technologically independently in a simple manner. Furthermore, these measures make it possible to realize an arrangement for the compensation of temperature dependences with only a small area requirement and also a low current consumption.

The oscillator circuit according to the invention advantageously contains a bandgap reference circuit, which provides a reference voltage. The bandgap reference circuit may preferably provide at least one of the partial currents. Furthermore, it is advantageous if the bandgap reference circuit is connected to the first and/or to the second circuit branch via at least one current mirror. The bandgap reference circuit may, for example, also contain the first resistor, across which is dropped the reference voltage generated by the bandgap reference circuit. What is advantageous about the measures relating to the bandgap reference circuit is that the bandgap reference circuit can generate a partial current which counteracts another partial current in terms of its temperature dependence and thus overall effects compensation of the temperature dependences. In this case, the other partial current may for example be predetermined and serve as a charging current of the charge storage device or for generating the comparator thresholds.

It is likewise advantageous if the at least one current mirror is designed for dynamic element matching. The element matching may be controlled for example by a control unit and be clocked with the operating clock provided by the oscillator circuit. Since this measure largely suppresses matching errors between the elements, this results in an even higher accuracy and temperature stability of the oscillator frequency.

In order to obtain an oscillator frequency with the highest possible temperature stability, it is advantageous to dimension the mutually superposed partial currents in the first and second circuit branches and in particular also partial currents in at least one further circuit branch such that linear and quadratic terms and in particular also higher-order terms of the temperature dependence of the oscillator frequency are compensated for. This reduces curving of the temperature response of the oscillator frequency. The partial currents may be generated for example in the bandgap reference circuit.

A further particularly advantageous refinement of the invention is characterized in that the oscillator circuit according to the invention contains at least one current mirror which, on the output side, feeds the first and/or the second circuit branch and to whose output a third resistor is connected. The third resistor has in particular the same temperature coefficient and/or the same resistance as the first and second resistors.

The circuit arrangement described above is based on the principle of a source degeneration circuit. A circuit of this type exploits the fact that a current mirror, which is temperature-independent, in principle, is detuned by the supplementary connection of a resistor, as a result of which the current mirror is subjected to a temperature dependence. Overall, compensation of the temperature dependences can be achieved by means of the source degeneration circuit. Furthermore, this measure may possibly obviate further current mirrors which, as described above, serve to generate further partial currents. The power consumption of the oscillator circuit is reduced as a result of obviating the further partial currents.

The first circuit branch preferably contains a first MOS transistor as controllable upward-integration current source, a second MOS transistor for switching the upward-integration process on and off and the charge storage device.

The components mentioned are connected in series in the first circuit branch.

In a further advantageous refinement, it is provided that, in the second circuit branch, the comparator has a third MOS transistor, the gate terminal of which is connected to the charge storage device. Furthermore, the comparator is connected in series with the second resistor. A differential voltage resulting from the difference between the upper and lower comparator thresholds is dropped across the second resistor.

Furthermore, it is advantageous to realize the controllable downward-integration current source with a bipolar transistor or with a fourth MOS transistor and to provide a fifth MOS transistor for switching the downward-integration process on and off. The bipolar transistor or the fourth MOS transistor and the fifth MOS transistor are arranged in series together with the charge storage device.

In a further advantageous refinement of the invention, the charge storage device is formed at least partly as a gate oxide capacitance. A gate oxide capacitance has a particularly small chip area requirement.

A further, particularly advantageous refinement of the invention provides for a sixth MOS transistor and the third MOS transistor to be connected in series via their drain-source paths. By means of this circuit arrangement, a second time constant is added to the main time constant which would determine the oscillator frequency without the sixth MOS transistor. The second time constant may have a temperature coefficient that deviates from the main time constant and thereby contribute to compensation of the temperature dependence of the oscillator circuit. Furthermore, the sixth MOS transistor, which, in particular, has the same conductivity type as the third MOS transistor, results in better operating voltage suppression since the two MOS transistors refer to the same supply line. The sixth MOS transistor is advantageously connected up as a diode.

The first and second resistors may advantageously be designed in such a way that they have small variations of their temperature coefficient and/or small variations of their absolute value. In this case, a small variation of the temperature coefficient entails a low temperature coefficient of the oscillator frequency and is advantageous in the implementation of the oscillator circuit according to the invention in a telecommunications chip. By contrast, when using the oscillator circuit for sensors, the absolute value of the oscillator frequency is more important than the temperature dependence of the oscillator frequency. Therefore, when implementing the oscillator circuit in a sensor, it is advantageous to use a type of resistor having only a small variation of its absolute value for the two resistors.

In an advantageous manner, all the resistors of the oscillator circuit have essentially the same temperature coefficients and, in particular, are of the same type of resistor. This ensures optimum stability of the oscillator frequency with respect to temperature fluctuations.

The oscillator circuit according to the invention is advantageously suitable for implementation in an integrated circuit. The integrated circuit with the oscillator circuit can advantageously be produced by means of CMOS (complementary metal oxide semiconductor) technology.

BRIEF DESCRIPTION OF THE DRAWINGS

The invention is explained in more detail below using exemplary embodiments with reference to the drawings, in which.

DETAILED DESCRIPTION OF EMBODIMENTS

Figure 1:
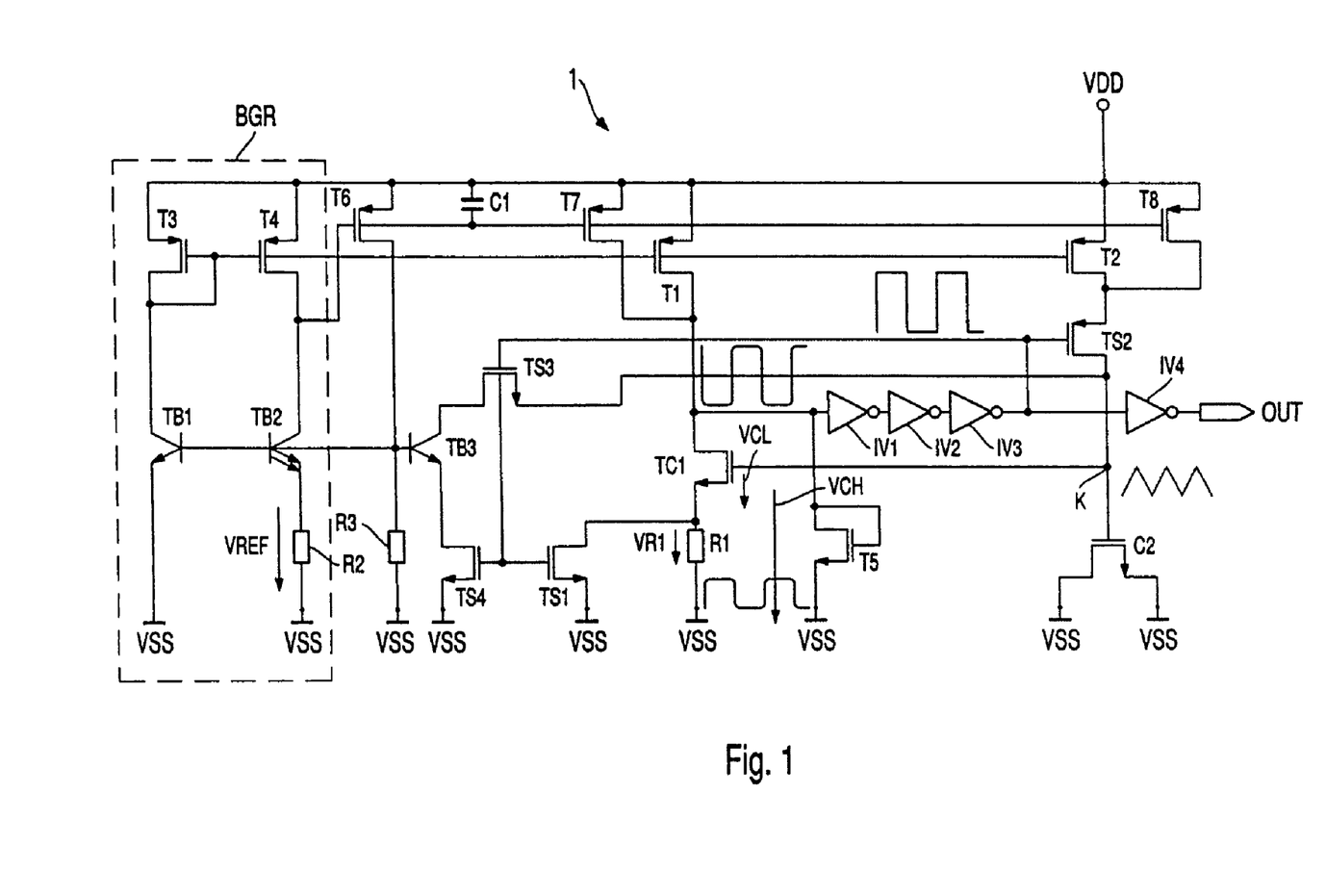
FIG. 1 shows a circuit diagram of a first exemplary embodiment of the temperature-stabilized oscillator circuit according to the invention.

FIG. 1 illustrates a circuit diagram of a temperature-stabilized oscillator circuit 1 as a first exemplary embodiment of the invention. The oscillator circuit 1 has a charge storage device C2, which is connected on the one hand to a common fixed potential, in particular a ground VSS, and on the other hand to a node K. The gate terminal of a MOS transistor TC1 is furthermore connected to the node K. The node K may be fed by an upward-integration circuit branch, which connects the node K to a supply voltage VDD via the drain-source paths of MOS transistors TS2 and T2. A further circuit branch formed by the drain-source path of a MOS transistor TS3, the collector-emitter path of a bipolar transistor TB3 and also the drain-source path of a MOS transistor TS4 serves for drawing current from the node K. This circuit branch conducts the drawn current away to ground VSS.

The drain-source path of the MOS transistor TC1 is connected by a comparator/reference voltage circuit branch on the one hand to ground VSS via a resistor R1 and on the other hand to the supply voltage VDD via the drain-source path of a MOS transistor T1. A MOS transistor TS1 is arranged in parallel with the resistor R1. The drain terminal of a MOS transistor T5 is connected to the connection path of the MOS transistors T1 and TC1. The gate terminal of the MOS transistor T5 is connected to its drain terminal, and the source terminal of the MOS transistor T5 is connected to ground VSS. Furthermore, the input of an inverting amplifier IV1 is connected between the MOS transistors T1 and TC1. Inverting amplifiers IV2, IV3 and IV4 are connected in series downstream of the inverting amplifier IV1. The output of the inverting amplifier IV3 is connected to the gate terminals of the MOS transistors TS1, TS2, TS3 and TS4. The output of the inverting amplifier IV4 is the output OUT of the oscillator circuit 1.

The oscillator circuit 1 contains a bandgap reference circuit BGR formed from MOS transistors T3 and T4, bipolar transistors TB1 and TB2 and also a resistor R2. The gate terminals of the MOS transistors T3 and T4 and also the base terminals of the bipolar transistors TB1 and TB2 are respectively connected to one another. The drain-source path of the MOS transistor T3 and T4, respectively, is on the one hand connected to the supply voltage VDD and on the other hand connected to the collector terminal of the bipolar transistor TB1 and TB2, respectively. Furthermore, the drain terminal of the MOS transistor T3 is connected to its gate terminal. The emitter terminal of the bipolar transistor TB1 is connected to ground VSS. The resistor R2 is arranged between the emitter terminal of the bipolar transistor TB2 and ground VSS.

The MOS transistor T3 represents the input transistor of a current source bank which serves for generating current in the drain-source paths of the MOS transistors T1, T2 and T4. For this purpose, the gate terminal of the MOS transistor T3 is coupled to the gate terminals of the MOS transistors T1, T2 and T4.

A MOS transistor T6 is connected in series with a resistor R3 between the supply voltage VDD and ground VSS. The gate terminal of the MOS transistor T6 is connected to the drain terminal of the MOS transistor T4. Furthermore, the gate terminal of the MOS transistor T6 is connected to the gate terminals of MOS transistors T7 and T8. The source terminals of the MOS transistors T6, T7 and T8 are connected to the supply voltage VDD. The drain terminal of the MOS transistor T7 is connected to the drain terminal of the MOS transistor T1. The drain terminal of the MOS transistor T8 is connected to the drain terminal of the MOS transistor T2. A capacitor C1 is arranged between the gate terminal of the MOS transistor T6 and the supply voltage VDD.

The base terminals of the bipolar transistors TB1 and TB2 are connected to the connection path between the MOS transistor T6 and the resistor R3 and are also connected to the base terminal of the bipolar transistor TB3.

In the case of the present oscillator circuit 1, the MOS transistors TC1, TS1, TS3, TS4 and T5 are n-channel MOSFETs. The MOS transistors TS2, T1, T2, T3, T4, T6, T7 and T8 are realized by p-channel MOSFETs. The bipolar transistors TB1, TB2 and TB3 are designed as npn transistors.

The function of the oscillator circuit 1 is to cyclically charge and discharge the charge storage device C2. In this case, the upward-integration circuit branch formed by the MOS transistors C2 and TS2 serves for charging the charge storage device C2. The MOS transistor T2 represents an upward-integration current source. The current flow from the MOS transistor T2 into the charge storage device C2 can be switched by the MOS transistor TS2. The circuit branch formed by the bipolar transistor TB3 and also the MOS transistors TS3 and TS4 is used for discharging the charge storage device C2. In this case, the bipolar transistor TB3 is a downward-integration current source which can be connected to the charge storage device C2 and ground VSS by the MOS transistors TS3 and TS4, respectively. In order to obtain a referenced current, the upward-integration and downward integration current sources are connected by their control terminals in each case to the bandgap reference circuit BGR.

A comparator in the form of the MOS transistor TC1, which detects the charge state of the charge storage device C2 with its gate terminal, serves for the changeover between charging and discharging of the charge storage device C2. The bandgap reference circuit BGR generates a reference voltage VREF across the resistor R2, which reference voltage is mirrored by means of the current mirror comprising the MOS transistors T3 and T1 in such a way that a voltage VR1 proportional to the reference voltage VREF is dropped across the resistor R1. The voltage VR1 is the difference between an upper comparator threshold voltage VCH and a lower comparator threshold voltage VCL. In this case, the lower comparator threshold voltage VCL is calculated from the sum of the threshold voltage of the MOS transistor TC1 and the effective gate-source voltage of the MOS transistor TC1. The upper comparator threshold voltage VCH is calculated from the sum of the lower comparator threshold voltage VCL and the voltage VR1.

The inverted amplifiers IV1, IV2 and IV3 control the MOS transistors TS2 and TS3, which are intended for switching the charging or discharging process on and off. The downward integration from the charge storage device C2 is effected after the upper comparator threshold voltage VCH has been reached, while the upward integration to the charge storage device C2 is effected after the lower comparator threshold voltage VCL has been reached. In this case, a triangular voltage forms across the charge storage device C2. The frequency of this oscillator triangular voltage is $1/(2 \cdot R1 \cdot C2)$, where R1 specifies the resistance of the resistor R1 and C2 specifies the capacitance of the charge storage device C2.

Furthermore, the MOS transistors TS1 and TS4 are controlled via the inverting amplifiers IV1, IV2 and IV3. In this case, the MOS transistor TS1 short-circuits the resistor R1 during the downward integration from the charge storage device C2. The MOS Transistor TS4 reduces the base currents of the bipolar transistors TB1 and TB2 during the downward integration from the charge storage device C2.

An amplified signal representing the oscillator frequency can be tapped off at the output OUT of the inverting amplifier IV4.

In the present first exemplary embodiment of the invention, the charge storage device C2 is realized by a gate oxide capacitance, which is preferably constructed vertically like the MOS transistor TC1.

The bias voltage required for the operation of the charge storage device C2 is equal to the sum of the threshold voltage of the MOS transistor TC1 and a few hundred mV. The fact that the lower comparator threshold voltage VCL is equal to the sum of the threshold voltage and the effective gate-source voltage of the MOS transistor TC1 always ensures the specified bias voltage for the charge storage device C2.

The comparator/reference voltage circuit branch formed from the MOS transistors T1 and TC1 and also the resistor R1 simultaneously satisfies three requirements. Thus, this circuit branch serves to realize the comparator threshold voltages VCL and VCH, to realize the comparator function and also to generate the bias voltage required for the charge storage device C2.

In the present first exemplary embodiment, the temperature stabilization of the oscillator frequency is effected by the addition of suitable currents. In this case, two currents are respectively superposed on one another, said currents having different or even oppositely directed temperature dependences or temperature coefficients. The superposed currents can flow statically or be switched by means of the oscillator clock. Overall, this results in compensation of temperature dependences, so that the oscillator frequency assumes a predetermined temperature coefficient or an essentially temperature-independent value.

The resistor R1 directly influences the value of the oscillator frequency and, in accordance with equation (1), has a temperature dependence which is to be compensated for by means of the invention:

$$R1 = R10 \cdot (1 + a \cdot (T-T0) + b \cdot (T-T0)^2), \quad (1)$$

where T specifies the temperature, a specifies the temperature coefficient relating to the linear temperature term, and b specifies the quadratic temperature coefficient. R10 denotes the resistance of the resistor R1 at a reference temperature T0 of 25° C., for example.

In the oscillator circuit 1, the temperature dependence of the resistor R1 as described by equation (1) is compensated for by the addition of the currents generated by the MOS transistors T1 and T7. The current flowing through the MOS transistor T1 is generated in the bandgap reference circuit BGR and mirrored into the MOS transistor T1 by the MOS transistor T3. The current flowing through the MOS transistor T3 is proportional to a PTAT (proportional to absolute temperature) voltage, which is proportional to the temperature in kelvins. This corresponds to a positive temperature coefficient. Since a current mirror itself ideally has no temperature dependence, the current through the MOS transistor T1 is also proportional to a PTAT voltage. By contrast, the current through the MOS transistor T7 is generated by mirroring of the current flowing through the MOS transistor T6. On account of the arrangement of the bipolar transistor TB2, the current flowing through the MOS transistor T6 is proportional to a base-emitter voltage. Consequently, the same also applies to the MOS transistor T7, and the latter accordingly has a negative temperature coefficient.

Overall, this results in a superposition of two currents which flow through the resistor R1 and whose temperature coefficients exhibit different signs. The known bandgap equations thus yield the following for the voltage VR1 dropped across the resistor R1:

$$VR1 = k1 \cdot (T/T0) - k2 \cdot (1 - (VG0 - VBE0)/VG0) \cdot (T/T0), \quad (2)$$

where k1 and k2 denote current mirror ratios, and VG0 and VBE0 specify gate and base-emitter voltages, respectively. The first addend in equation (2) rises with the temperature, while the second addend falls as the temperature rises. Since k1 and k2 are only current mirror ratios, it is possible to generate a correction voltage across the resistor R1 in a technology-independent manner. The voltage thus corrected can be set to the same temperature coefficient as the resistor R1.

Owing to its comparatively small temperature coefficient, the gate oxide capacitance of the charge storage device C2 has only very little influence on the oscillator frequency.

Furthermore, the invention provides for the resistors R1 and R2 and preferably also the resistor R3 to have identical temperature coefficients and preferably also identical resistances. In particular when implementing the oscillator circuit 1 in a telecommunications chip, it is advantageous if a type of resistor having only a small technological variation of its temperature coefficient is used for the resistors R1, R2 and R3. This results in an optimum temperature stability of the oscillator frequency, and a technological variation which would be caused by the use of different resistors is obviated.

In contrast to this, known oscillator circuits in which attempts are made to obtain a temperature stability through mixing ratios of resistors have a fundamental temperature dependence caused by technological resistor variations. For two resistors R1 and R2 having the temperature coefficients a1 and a2, respectively, this dependence of the temperature coefficient is approximately (a1−a2)·R1/(R1+R2). This means that, given a difference between the two temperature coefficients a1 and a2 of 3000 ppm/K, for example, and given resistances of similar magnitude of the resistors R1 and R2, as a result of a sheet resistance change of 20% the temperature coefficient already changes by 250 ppm/K.

In the present first exemplary embodiment of the invention, the above-described measure for the compensation of the temperature dependence of the comparator/reference voltage circuit branch is also used in an analogous manner for the upward-integration circuit branch. For this purpose, the MOS transistor T8 is used in a manner corresponding to the MOS transistor T7, a current mirrored by the MOS transistor T6 likewise flowing through said MOS transistor T8 and the latter thereby also having a proportionality to the base-emitter voltage. The current flowing through the MOS transistor T2 is once again proportional to a PTAT voltage, thus resulting in temperature compensation in the same way as described above.

In the case of currents which are proportional to a base-emitter voltage, according to the bandgap equations the non-linear components are given by the term $((n-1+a) \cdot k \cdot T / q \cdot \ln(T/T0))/VG0$, where n denotes a technology parameter. The nonlinear components of a PTAT current are essentially given by the term 1+b. The admixture of currents through the MOS transistors T7 and T8 increases or decreases the nonlinear components, thus resulting in the possibility of compensation of the quadratic components of the resistor R1.

In order that the temperature compensation described above is made reproducible and errors of the temperature coefficients are not caused by matching errors in the current mirrors, it is advantageous to compensate the respective transistors within a current mirror by means of dynamic element matching.

The first exemplary embodiment of the invention as shown in FIG. 1 exhibits a further possibility for temperature compensation, which can possibly also be realized independently of the admixture of currents through the MOS transistors T7 and T8. This possibility results from the arrangement of the MOS transistor T5 at the drain terminal of the MOS transistor TC1. This results in an increase in the pole frequency at the output of the comparator and, at the same time, in the generation of a second very short and well-defined time constant which contributes to the oscillator frequency in addition to the main time constant formed from the term 2·R1·C2.

The second time constant generated by the MOS transistor T5 is determined by the transconductance gm of the transistor T5. The transconductance gm is given by equations (3) and (4):

$$gm = \sqrt{2 \cdot \beta \cdot I_D} \quad (3)$$

$$\beta = \mu \cdot C_{ox} \cdot \frac{W}{L} \quad (4)$$

In equations (3) and (4), all the parameters refer to the MOS transistor T5. Specifically, β denotes the transconductance coefficient, $I_D$ denotes the drain current, W and L denote the channel width and length, respectively, μ denotes the mobility of the charge carriers in the channel, and $C_{ox}$ denotes the capacitance of the gate oxide of the MOS transistor T5.

The temperature coefficients of the mobility μ and of the drain current $I_D$ are for example −5000 ppm/K and 3000 ppm/K, respectively. This results in a value of approximately −1000 ppm/K for the temperature coefficient of the transconductance gm, whereas the resistor R1 may have a temperature coefficient of 200 ppm/K. It becomes clear from this that a summation of the main time constant with the second time constant enables compensation of the temperature dependence of the total time constant and thus of the oscillator frequency.

A further advantage of the MOS transistor T5 is that its arrangement at the drain terminal of the MOS transistor TC1 defines the voltage swing at the output of the comparator.

The two MOS transistors TC1 and T5 preferably have the same conductivity type and refer to the same supply line. These measures have the advantage that the potentials at the input and at the output of the comparator are thereby independent of the supply voltage VDD.

A further possibility for compensating for the temperature dependences is given by a source degeneration circuit. In this case, resistors having the same resistances as the resistors R1 and R2 are connected for example to the drain terminals of the MOS transistors T1 and/or T2. These resistors detune the current mirrors formed from the MOS transistors T3 and T1 and, respectively, T3 and T2. In principle, current mirrors have a temperature-independent behavior. However, the detuning of the current mirrors impresses on said current mirrors temperature coefficients which can be used to compensate for other temperature coefficients. What is advantageous about this measure is that the MOS transistors T7 and T8 can be obviated, thereby reducing the power consumption of the oscillator circuit 1.

The output current IOUT of a current mirror that is detuned by means of a source degeneration circuit is given by equations (5) and (6):

$$IOUT = \frac{IIN}{1 + \sqrt{2 \cdot \beta(T) \cdot R_{SD}(T)^2 \cdot IIN}} \quad (5)$$

$$\beta(T) = \mu(T) \cdot C_{ox} \cdot \frac{W}{L} \quad (6)$$

in equation (5) IIN specifies the input current of the current mirror and $R_{SD}$ denotes the resistor arranged at the output of the current mirror. The remaining parameters are defined in an analogous manner to equation (4).

The following results from this for the temperature-dependent oscillator frequency f(T):

$$\frac{1}{f(T)} = 2 \cdot R1(T) \cdot C2 \cdot \left(1 + \sqrt{\frac{1}{2} \cdot \beta(T) \cdot \frac{R_{SDO}}{R_{30}} \cdot R_{SD}(T) \cdot \Delta U_{BE}(T)}\right) \quad (7)$$

In this case, the mobility μ(T) and the transconductance coefficient β(T) are very well-defined parameters with an error of in each case typically ±5%. Provided that the temperature coefficient of the type of resistor used is small enough, the temperature compensation is insensitive to fluctuations in the absolute values of the resistors.

In an alternative embodiment of the present invention, the bipolar transistors TB1, TB2 and TB3 may be replaced by MOS transistors which are operated in the weak inversion range.

The MOS transistors TS1, TS2, TS3 and TS4 may also be formed by other switches.

Digital gates may be provided instead of the inverting amplifiers IV1, IV2, IV3 and IV4.

A mirrored PTAT current which is generated in the bandgap reference circuit BGR in each case flows through the MOS transistors T1 and T2. As a result, a noise generated in the bandgap reference circuit BGR is also superposed on said currents. A current through the MOS transistor T1 that is increased by noise increases both the lower comparator threshold voltage VCL and the upper comparator threshold voltage VCH. The oscillator frequency remains uninfluenced in the case of a current through the upward-integration circuit branch that is likewise increased by noise. However, the two comparator threshold voltages VCL and VCH increase to the same extent only in the event of low-frequency noise. This means that low-frequency 1/f noise does not lead to an increase in the frequency jitter.

The first exemplary embodiment of the invention as shown in FIG. 1 does not have more than one threshold voltage of a MOS transistor or more than one base-emitter voltage of a bipolar transistor in series in any circuit branch between the supply voltage VDD and ground VSS. Therefore, the present exemplary embodiment is suitable for very low supply voltages VDD. By virtue of the fact that the comparator/reference voltage circuit branch is designed jointly for the comparator, the generation of the comparator threshold voltages VCL and VCH and also the bias voltage generation for the charge storage device C2, the oscillator circuit 1, owing to the very low current consumption resulting from this, is particularly well suited to the generation of an operating clock during standby operation. Moreover, the oscillator circuit 1 has a small chip area requirement.

Figure 2:
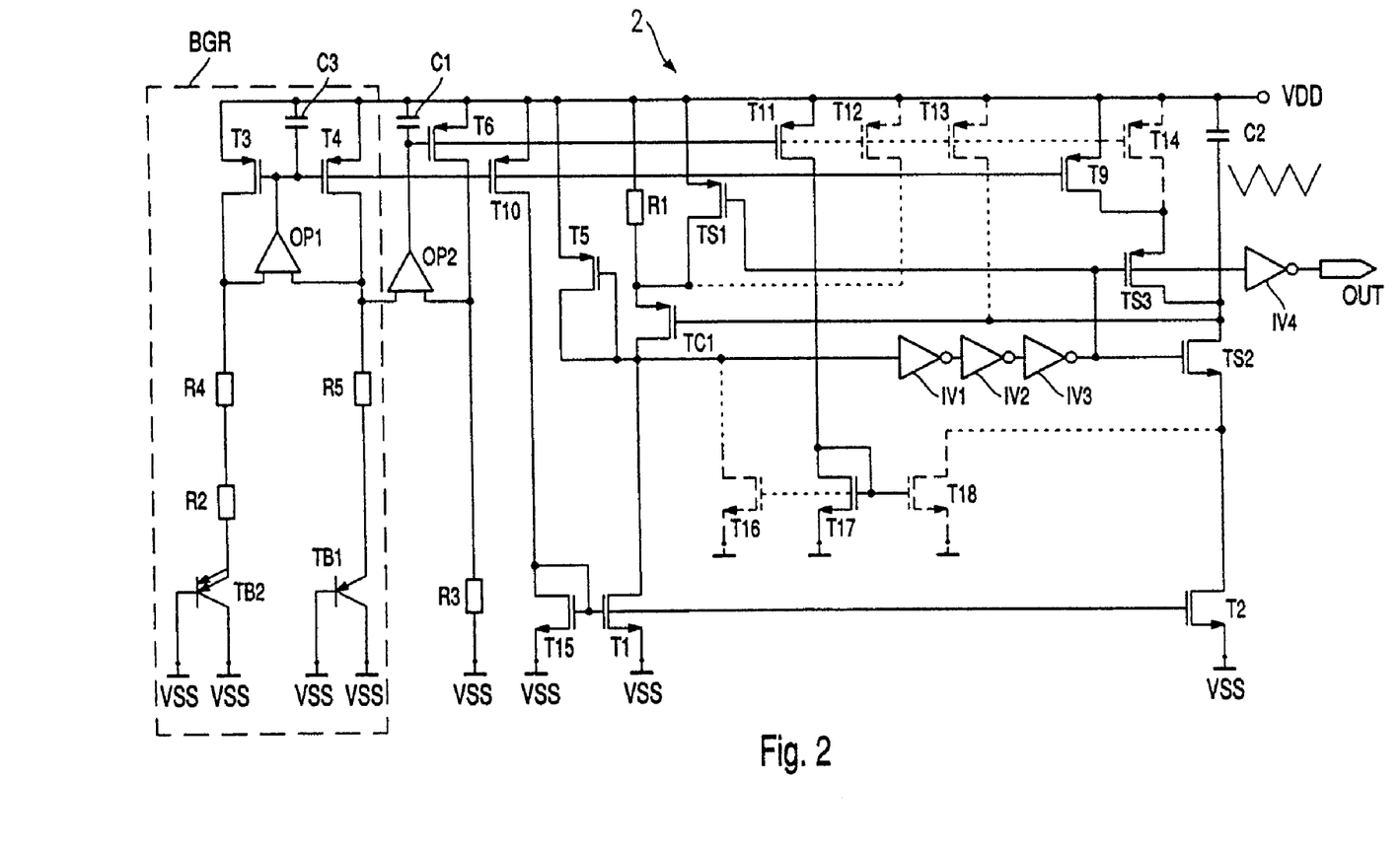
FIG. 2 shows a circuit diagram of a second exemplary embodiment of the temperature-stabilized oscillator circuit according to the invention.

FIG. 2 illustrates a circuit diagram of a temperature-stabilized oscillator circuit 2 as a second exemplary embodiment of the invention. The oscillator circuit 2 corresponds in many circuit parts to the oscillator circuit 1 shown in FIG. 1. Therefore, the same or comparable functional elements are provided with the same reference symbols.

In the oscillator circuit 2, the charge storage device C2 is a capacitor, one terminal of which is connected to the supply voltage VDD instead of ground VSS. The reference potentials of the remaining components in the oscillator circuit 2 are correspondingly modified in comparison with the oscillator circuit 1.

In the oscillator circuit 2, the downward-integration current source is realized by a MOS transistor T9 having a p-doped channel. Furthermore, the oscillator circuit 2 has operational amplifiers OP1 and OP2 for the application of the gate potentials of the MOS transistors T3 and T4 and, respectively T6.

The oscillator circuit 2 contains MOS transistors T10, T11, T12, T13 and T14, whose channel is p-doped, and MOS transistors T15, T16, T17 and T18, whose channel is n-doped. Some of these MOS transistors and some of their connecting lines to the other components are depicted by dashed lines in FIG. 2. This indicates that the relevant MOS transistors can optionally be included in the oscillator circuit 2 or can be designed in switchable fashion.

In FIG. 2, on account of the circuitry of the MOS transistor T6, the current flowing through the MOS transistor T6 has a proportionality with a CTAT (complementary to absolute temperature) voltage. The temperature coefficient of this current is accordingly negative. It is mirrored into the MOS transistors T11, T12, T13 and T14 by current mirror arrangements. On account of the fundamental temperature independence of a current mirror, the currents flowing through said MOS transistors also have an oppositely directed behavior with respect to the temperature.

The currents flowing through the MOS transistors T3 and T4 are proportional to a PTAT voltage. A current which is proportional to the temperature is generated for example in the MOS transistor T10 too, by current mirroring.

By means of the MOS transistors depicted by dashed lines in FIG. 2, it is possible to form differences or sums with already existing currents, thereby compensating for temperature dependences. Specifically, the MOS transistor T12 serves for difference formation with the current generated by the MOS transistor T1 in the comparator/reference voltage circuit branch. The MOS transistors T13 and T14 in each case generate currents which are subtracted from the current generated by the MOS transistor T2 in the upward-integration circuit branch. The currents generated by the MOS transistors T16 and T18 in each case form a sum with the currents generated by the MOS transistors T1 and T2, respectively, in the comparator/reference voltage or upward-integration circuit branch.

We claim:

1. A temperature-stabilized oscillator circuit based on cyclic charging and discharging of a charge storage device, comprising:
   a charge storage device,
   a controllable upward-integration current source for charging the charge storage device,
   a controllable downward-integration current source for discharging the charge storage device,
   a bandgap reference circuit for generating a reference voltage, which is dropped across a first resistor contained in the bandgap reference circuit,
   a second resistor, across which is dropped a voltage which is proportional to the reference voltage, the two resistors essentially having the same temperature coefficients,
   a comparator for controlling the upward-integration current source and the downward-integration current source in a manner dependent on the charge state of the charge storage device, a predetermined lower comparator threshold and a predetermined upper comparator threshold,
   a first circuit branch containing the controllable upward-integration current source or the controllable downward integration current source, and
   a second circuit branch containing the comparator and/or serving to generate the two comparator thresholds (VCL, VCH), wherein
   the first circuit branch and/or the second circuit branch comprising, at least occasionally, in each case two mutually superposed partial currents with different temperature dependences,
   the first circuit branch and the second circuit branch and in particular at least one further circuit branch of the oscillator circuit in each case having, at least occasionally, a sum or a difference of two superposed partial currents with different temperature dependences,
   the partial currents being able to be set or being set in such a way that linear terms and quadratic terms and in particular higher-order terms of the temperature dependence of the oscillator frequency are essentially minimized, and
   the partial currents being generated in particular by the bandgap reference circuit.

2. The temperature-stabilized oscillator circuit as claimed in claim 1, wherein
   the first resistor and the second resistor are of the same type of resistor.

3. The temperature-stabilized oscillator circuit as claimed in claim 1, wherein
   at least one of the partial currents can be generated by means of the bandgap reference circuit.

4. The temperature-stabilized oscillator circuit as claimed in claim 1, wherein
   the bandgap reference circuit is connected to the first and/or to the second circuit branch via at least one current mirror.

5. The temperature-stabilized oscillator circuit as claimed in claim 4, wherein
   the at least one current mirror is designed for dynamic element matching.

6. The temperature-stabilized oscillator circuit as claimed in claim 1, further comprising:
   at least one current mirror which feeds the first circuit branch and/or the second circuit branch and to whose output a third resistor is connected, the third resistor having in particular the same temperature coefficient and/or the same resistance as the first and second resistors.

7. The temperature-stabilized oscillator circuit as claimed in claim 1, wherein
   a first MOS transistor as controllable upward-integration current source, a second MOS transistor for switching the upward-integration operation on and off and the charge storage device are connected in series in the first circuit branch.

8. The temperature-stabilized oscillator circuit as claimed in claim 1, wherein in the second circuit branch, the comparator in the form of a third MOS transistor, the gate terminal of which is connected to the charge storage device, is connected in series with the second resistor, across which is dropped a differential voltage formed from the difference between the upper comparator threshold and the lower comparator threshold.

9. The temperature-stabilized oscillator circuit as claimed in claim 1, wherein
the controllable downward integration current source in the form of a bipolar transistor or a fourth MOS transistor, a fifth MOS transistor for switching the downward-integration operation on and off and the charge storage device are connected in series.

10. The temperature-stabilized oscillator circuit as claimed in claim 1, wherein
the charge storage device is formed at least partly as a gate oxide capacitance.

11. The temperature-stabilized oscillator circuit as claimed in claim 1, further comprising:
a sixth MOS transistor, which is connected in series with the third MOS transistor and has in particular the same conductivity type as the third MOS transistor.

12. The temperature-stabilized oscillator circuit, as claimed in claim 11, wherein
the sixth MOS transistor is connected as a diode.

13. The temperature-stabilized oscillator circuit as claimed in claim 1, wherein
the first resistor and the second resistor have small variations of their temperature coefficient and/or small variations of their absolute value.

14. The temperature-stabilized oscillator circuit as claimed in claim 1, wherein
all the resistors of the oscillator circuit essentially have the same temperature coefficients and, in particular, are of the same type of resistor.

15. The temperature-stabilized oscillator circuit as claimed in claim 1, wherein
the components of the oscillator circuit are monolithically integrated on a common fixed substrate.

16. The temperature-stabilized oscillator circuit as claimed in claim 15, wherein
the oscillator circuit is realized by means of CMOS technology.

* * * * *